United States Patent
Imai et al.

(10) Patent No.: US 7,405,365 B2
(45) Date of Patent: Jul. 29, 2008

(54) WIRING SUBSTRATE AND METHOD FOR MANUFACTURING THE SAME

(75) Inventors: Hajime Imai, Mie (JP); Osamu Sugimoto, Mie (JP); Katsuhiro Okada, Mie (JP); Isao Ogasawara, Mie (JP)

(73) Assignee: Sharp Kabushiki Kaisha, Osaka (JP)

( * ) Notice: Subject to any disclaimer, the term of this patent is extended or adjusted under 35 U.S.C. 154(b) by 486 days.

(21) Appl. No.: 10/664,158

(22) Filed: Sep. 17, 2003

(65) Prior Publication Data

US 2004/0066637 A1 Apr. 8, 2004

(30) Foreign Application Priority Data

Oct. 3, 2002 (JP) ............................. 2002-291085

(51) Int. Cl.
*H05K 1/16* (2006.01)
(52) U.S. Cl. ..................... 174/260; 174/255; 174/262; 29/852
(58) Field of Classification Search ................. 174/250, 174/254, 255, 260, 261; 349/149, 150; 29/852
See application file for complete search history.

(56) References Cited

U.S. PATENT DOCUMENTS

| 5,677,745 | A |   | 10/1997 | Kawano et al. |
|-----------|---|---|---------|---------------|
| 5,734,458 | A | * | 3/1998  | Ikubo et al. .................. 349/149 |
| 5,781,253 | A | * | 7/1998  | Koike et al. .................... 349/40 |
| 2002/0089614 | A1 | * | 7/2002 | Kim ............................. 349/40 |
| 2004/0027502 | A1 |   | 2/2004  | Tanaka et al. |

FOREIGN PATENT DOCUMENTS

JP          08-114815 A       5/1996

* cited by examiner

*Primary Examiner*—Ishwar B. Patel
(74) *Attorney, Agent, or Firm*—Birch, Stewart, Kolasch & Birch, LLP

(57) ABSTRACT

A wiring substrate of the present invention includes a short ring (SR) formed along a periphery of the substrate, an independent line pattern (e.g., a gate terminal) that is coplanar with and independent of SR, a continuous line pattern (e.g., a storage capacitor stem) that is located closest to the independent line pattern and is coplanar and continuous with SR, and an insulating film covering the independent line pattern and the continuous line pattern. The insulating film includes a first through hole reaching the independent line pattern and a second through hole reaching the continuous line pattern.

12 Claims, 11 Drawing Sheets

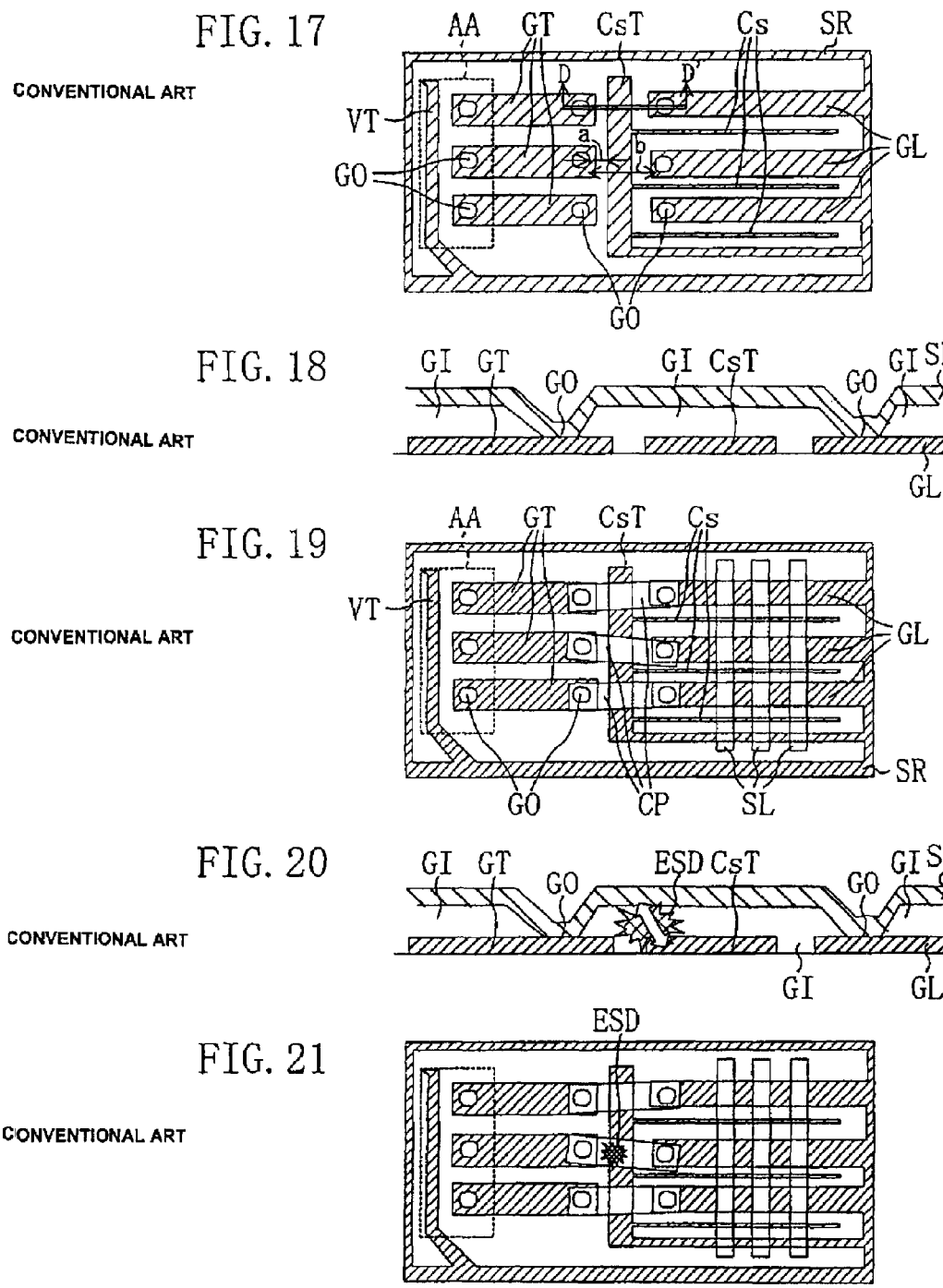

WIRING SUBSTRATE AND METHOD FOR MANUFACTURING THE SAME

This nonprovisional application claims priority under 35 U.S.C. § 119(a) on Patent Application No(s). 2002-291085 filed in JAPAN on Oct. 3, 2002, which is(are) herein incorporated by reference.

BACKGROUND OF THE INVENTION

1. Field of the Invention

The present invention relates to a wiring substrate and a method for manufacturing the same. The wiring substrate of the present invention can be used in a liquid crystal display device, an organic or inorganic EL (electroluminescent) display device, a plasma display device, an electrochromic display device, or the like.

2. Description of the Background Art

On a TFT (thin film transistor) substrate used in a liquid crystal display device, or the like, a ring-shaped conductor pattern called "short ring" (hereinafter referred to as "SR") is provided along the periphery of the substrate in order to prevent an electrostatic discharge (hereinafter referred to as "ESD") damage while manufacturing the TFT substrate. Gate bus lines, storage capacitor lines, source bus lines, dummy lines, etc., are connected to SR. SR is typically removed in the scribing step or the beveling step after assembling the panel (see, for example, Japanese Laid-Open Patent Publication No. 8-234227).

FIG. 17 is a plan view schematically illustrating a TFT substrate being manufactured, after depositing a conductive film from which source bus lines are to be formed (hereinafter referred to also as "source film") across the entire surface of the substrate. FIG. 18 is a cross-sectional view taken along line D-D' of FIG. 17. A plurality of gate bus lines GL extending in the row direction, a plurality of storage capacitor lines Cs extending parallel to the gate bus lines GL, and gate terminals GT for electrically connecting the gate bus lines GL with the IC chip are formed on the substrate. In a case where the routing of the lines is difficult because of spatial limitations, a storage capacitor stem CsT connecting together a plurality of storage capacitor lines Cs may need to be provided between the gate bus lines GL and the gate terminals GT, as illustrated in FIG. 17, for example. Thus, there are gate metal lines connected to SR (e.g., the storage capacitor stem CsT, the gate bus lines GL and the dummy lines), and gate metal islands not connected to SR (e.g., COG (chip on glass) gate terminals and COG source terminals).

Moreover, a terminal VT for supplying a power supply voltage to the IC chip and other lines (not shown) for inputting driving signals to the IC chip are formed in an IC chip attachment area AA. A gate insulating film GI and a source film SF are successively deposited on these line patterns.

The gate insulating film GI includes a through hole GO near one end of each of the gate bus lines GL and the gate terminals GT. The charge that has been accumulated on the gate metal islands due to triboelectric charging, or the like, in the manufacturing process up to the deposition of the source film SF flows to the lines connected to SR via the through holes GO upon deposition of the source film SF. Thus, as the charge accumulated on the gate metal islands is released to SR, the lines on the substrate are all brought to an equipotential state. Note that the gate insulating film GI also includes the through holes GO in regions where the gate terminals GT overlap with the IC chip attachment area AA.

The deposited source film SF is then patterned to form source bus lines SL and connection patterns CP for connecting the gate bus lines GL with the gate terminals GT. FIG. 19 is a plan view schematically illustrating the TFT substrate after patterning the source film SF.

However, ESD occurs in a case where the distance between the through hole GO of a gate metal island and a gate metal line is shorter than the distance between the through hole GO of the gate island and the through hole GO of the gate metal line, e.g., in a case where the distance "a" between the through hole GO of the gate terminal GT and the storage capacitor stem CsT is shorter than the distance "b" between the through hole GO of the gate terminal GT and the through hole GO of the gate bus line GL. FIG. 20 is a cross-sectional view illustrating an occurrence of ESD. On the instant the source film SF is deposited, before the entire surface of the substrate is brought to an equipotential state, the potential difference (charge) created between the gate island and the gate metal line due to triboelectric charging, or the like, passes to a gate metal line portion that is closest to the gate island, thereby causing ESD.

FIG. 21 is a plan view illustrating the location where ESD occurs. In a case where ESD occurs in an area where a connection pattern CP for connecting the gate bus line GL with the gate terminal GT is formed, as illustrated in FIG. 21, a leak occurs between the gate bus line GL and the storage capacitor line Cs, thereby making the product defective.

SUMMARY OF THE INVENTION

It is an object of the present invention to reduce the possibility of a product to become defective due to ESD, in other words, to improve the production yield, to reduce the manufacturing cost, and to improve the throughput.

According to the present invention, in a case where some portions of the TFT are in an island structure, for example, a contact window is provided in the insulating film on the short ring near the islands so that the charge (potential difference) created in the islands is allowed to flow to the short ring using a film to be deposited thereafter. Thus, it is possible to prevent an ESD damage.

Even in a case where the contact window cannot be provided, the line patterns are arranged so that ESD occurs selectively at locations around the island patterns such that the occurrence of ESD will not influence the quality of the final product. Therefore, it is possible to improve the production yield, to reduce the manufacturing cost, and to improve the throughput.

A wiring substrate according to the first aspect of the present invention is a wiring substrate, including a short ring formed along a periphery of the substrate, an independent line pattern that is coplanar with and independent of the short ring, a continuous line pattern that is located closest to the independent line pattern and is coplanar and continuous with the short ring, and an insulating film covering the independent line pattern and the continuous line pattern, wherein the insulating film includes a first through hole reaching the independent line pattern and a second through hole reaching the continuous line pattern.

It is preferred that a distance between the first through hole and the continuous line pattern is longer than a distance between the second through hole and the continuous line pattern along a virtual line extending between the first through hole and the second through hole. Herein, the distance between the first or second through hole and the continuous line pattern is the shortest distance, along the surface of the insulating film, between the edge of the opening of the first or second through hole and the edge of the continuous line pattern. The term "distance" as used herein refers to a distance defined in a plan view.

A wiring substrate according to the second aspect of the present invention is a wiring substrate, including a short ring formed along a periphery of the substrate, an independent line pattern that is coplanar with and independent of the short ring, a first continuous line pattern that is coplanar and continuous with the short ring, a second continuous line pattern that is located between the independent line pattern and the first continuous line pattern and is coplanar and continuous with the short ring, and an insulating film covering the independent line pattern and the first and second continuous line patterns, wherein: the insulating film includes a first through hole reaching the independent line pattern, a second through hole reaching the first continuous line pattern, and a third through hole reaching the second continuous line pattern; the independent line pattern and the first continuous line pattern are electrically connected to each other by a connection pattern bridging the second continuous line pattern via the first through hole and the second through hole; and the third through hole is formed in an area other than an area where the connection pattern is formed.

A wiring substrate according to the third aspect of the present invention is a wiring substrate, including a short ring formed along a periphery of the substrate, an independent line pattern that is coplanar with and independent of the short ring, a first continuous line pattern that is coplanar and continuous with the short ring, a second continuous line pattern that is located between the independent line pattern and the first continuous line pattern and is coplanar and continuous with the short ring, and an insulating film covering the independent line pattern and the first and second continuous line patterns, wherein: the insulating film includes a first through hole reaching the independent line pattern and a second through hole reaching the first continuous line pattern; the independent line pattern and the first continuous line pattern are electrically connected to each other by a connection pattern bridging the second continuous line pattern via the first through hole and the second through hole; the second continuous line pattern includes a protruding portion that is located in an area other than an area where the connection pattern is formed and is protruding toward the independent line pattern while being coplanar with the short ring; and a distance between the first through hole and the second continuous line pattern in the area where the connection pattern is formed is longer than a distance between the first through hole and the protruding portion.

In the wiring substrate according to the third aspect of the present invention, it is preferred that the insulating film includes a third through hole reaching the protruding portion in the area where the protruding portion is formed. in such a case, it is preferred that a distance between the first through hole and the second continuous line pattern in the area where the connection pattern is formed is longer than a distance between the first through hole and the third through hole.

In the wiring substrate according to the third aspect of the present invention, the connection pattern may be electrically connected to the protruding portion via the third through hole, and the protruding portion may be independent of the second continuous line pattern.

In the wiring substrate according to the second aspect of the present invention, it is preferred that a distance between the first through hole and the second continuous line pattern is longer than a distance between the third through hole and the second continuous line pattern along a virtual line extending between the first through hole and the third through hole.

Moreover, in the wiring substrate according to the third aspect of the present invention, wherein the insulating film includes a third through hole reaching the protruding portion in the area where the protruding portion is formed, it is preferred that a distance between the first through hole and the second continuous line pattern is longer than a distance between the third through hole and the second continuous line pattern along a virtual line extending between the first through hole and the third through hole.

A display apparatus of the present invention includes a wiring substrate of the present invention.

A manufacturing method according to the first aspect of the present invention is a method for manufacturing the wiring substrate according to the second or third aspect of the present invention, the method including the steps of: forming the first through hole and the second through hole in the insulating film; forming a conductive film on the substrate; and patterning the conductive film so as to form the connection pattern.

A manufacturing method according to the second aspect of the present invention is a method for manufacturing the wiring substrate according to the third aspect of the present invention, wherein: the insulating film includes a third through hole reaching the protruding portion in the area where the protruding portion is formed; and the connection pattern is electrically connected to the protruding portion via the third through hole, and the protruding portion is independent of the second continuous line pattern, the method including the steps of forming the first through hole, the second through hole and the third through hole in the insulating film; forming a conductive film on the substrate; patterning the conductive film so as to form the connection pattern; and cutting off a connecting portion between the protruding portion and the second continuous line pattern.

BRIEF DESCRIPTION OF THE DRAWINGS

FIG. 17 is a plan view schematically illustrating a TFT substrate being manufactured, after depositing a source film across the entire surface of the substrate.

FIG. 18 is a cross-sectional view taken along line D-D' of FIG. 17.

FIG. 19 is a plan view schematically illustrating the TFT substrate after patterning the source film.

FIG. 20 is a cross-sectional view illustrating an occurrence of ESD.

FIG. 21 is a plan view illustrating the location where ESD occurs.

DETAILED DESCRIPTION OF THE PREFERRED EMBODIMENTS

Preferred embodiments of the present invention will now be described with reference to the drawings.

Embodiment 1

Figure 1:
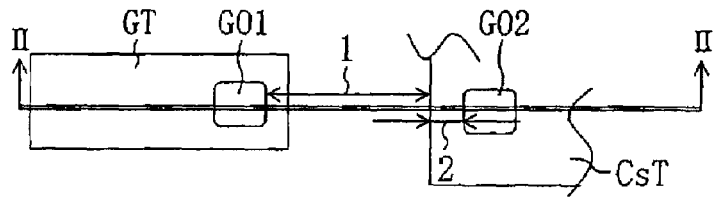
FIG. 1 is a schematic plan view illustrating a wiring substrate of Embodiment 1.
Figure 2:
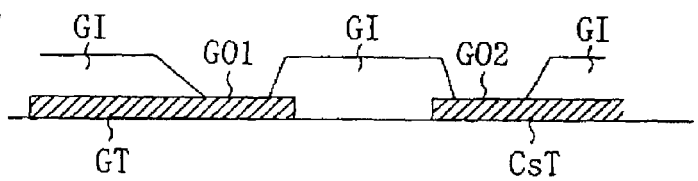
FIG. 2 is a cross-sectional view taken along line II-II of FIG. 1.

A wiring substrate of Embodiment 1 is an embodiment of a wiring substrate according to the first aspect of the present invention. FIG. 1 is a schematic plan view illustrating the wiring substrate of Embodiment 1, and FIG. 2 is a cross-sectional view taken along line II-II of FIG. 1.

The wiring substrate of the present embodiment includes SR (not shown) formed along the periphery of the substrate, the gate terminal GT that is coplanar with and independent of SR, the storage capacitor stem CsT that is located closest to the gate terminal GT and is coplanar and continuous with SR, and the gate insulating film GI covering the gate terminal GT and the storage capacitor stem CsT. The gate insulating film GI includes a first through hole GO1 reaching the gate terminal GT, and a second through hole GO2 reaching the storage capacitor stem CsT.

The gate insulating film GI includes an opening above the storage capacitor stem CsT located closest to the electrically-isolated gate terminal GT. Therefore, on the instant the source film SF is deposited, the charge accumulated on the gate terminal GT moves to the storage capacitor stem CsT, which is connected to SR, via the first through hole GO1 and the second through hole GO2. Thus, it is possible to prevent ESD.

It is preferred that the distance 1 between the first through hole GO1 and the storage capacitor stem CsT is longer than the distance 2 between the second through hole GO2 and the storage capacitor stem CsT along the virtual line extending between the first through hole GO1 and the second through hole GO2. When the source film SF is deposited by a sputtering method or a CVD (chemical vapor deposition) method, an electrical connection is established between the gate terminal GT and the storage capacitor stem CsT via the first through hole GO1 and the second through hole GO2 at or near the midpoint of the virtual line extending between the first through hole GO1 and the second through hole GO2.

Note that in the present embodiment, the distance 1 between the first through hole GO1 and the storage capacitor stem CsT is, strictly speaking, the shortest distance between the edge of a portion of the surface of the gate terminal GT that is exposed through the first through hole GO1 and the edge of the storage capacitor stem CsT. Similarly, the distance 2 between the second through hole GO2 and the storage capacitor stem CsT is the shortest distance between the edge of a portion of the surface of the storage capacitor stem CsT that is exposed through the second through hole GO2 and the edge of the storage capacitor stem CsT.

Figure 22:
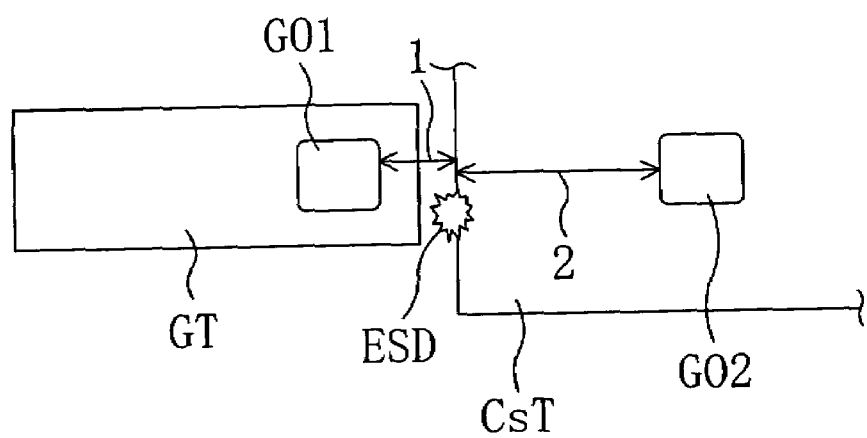
FIG. 22 is a schematic plan view illustrating an occurrence of ESD in a case where the distance 1 is shorter than the distance 2.

FIG. 22 is a schematic plan view illustrating an occurrence of ESD in a case where the distance 1 is shorter than the distance 2. When the distance 1 is shorter than the distance 2, the charge accumulated on the gate terminal GT passes to the edge of the storage capacitor stem CsT close to the first through hole GO1, thereby causing ESD, before an electrical connection is established between the gate terminal GT and the storage capacitor line via the first through hole GO1 and the second through hole GO2. When the distance 1 is longer than the distance 2, the charge accumulated on the gate terminal GT moves to the storage capacitor stem CsT via the second through hole GO2 because an electrical connection is established between the gate terminal GT and the storage capacitor line via the first through hole GO1 and the second through hole GO2 before the charge passes to the edge of the storage capacitor stem CsT. Therefore, it is possible to more reliably prevent ESD by setting the distance 1 to be longer than the distance 2.

Embodiment 2

Figure 3:
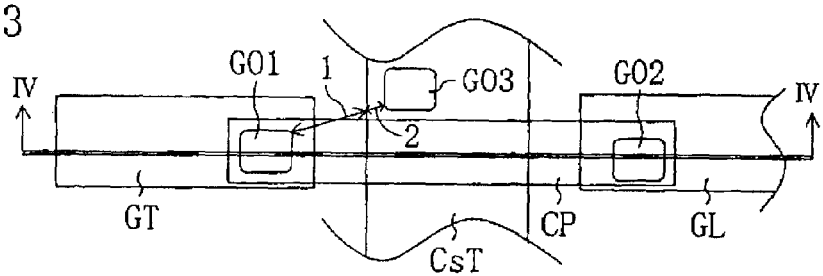
FIG. 3 is a schematic plan view illustrating a wiring substrate of Embodiment 2.
Figure 4:
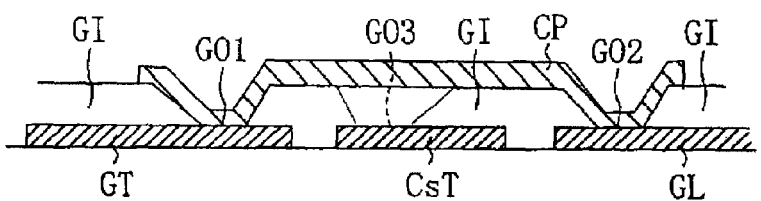
FIG. 4 is a cross-sectional view taken along line IV-IV of FIG. 3.

A wiring substrate of Embodiment 2 is an embodiment of a wiring substrate according to the second aspect of the present invention. FIG. 3 is a schematic plan view illustrating the wiring substrate of Embodiment 2, and FIG. 4 is a cross-sectional view taken along line IV-IV of FIG. 3.

The wiring substrate of the present embodiment includes SR (not shown) formed along the periphery of the substrate, the gate terminal GT that is coplanar with and independent of SR, the gate bus line GL that is coplanar and continuous with SR, the storage capacitor stem CsT that is located between the gate terminal GT and the gate bus line GL and is coplanar and continuous with SR, and the gate insulating film GI covering the gate terminal GT, the gate bus line GL and the storage capacitor stem CsT. The gate insulating film GI includes the first through hole GO1 reaching the gate terminal GT, the second through hole GO2 reaching the gate bus line GL, and a third through hole GO3 reaching the storage capacitor stem CsT.

The gate terminal GT and the gate bus line GL are electrically connected to each other by the connection pattern CP bridging the storage capacitor stem CsT via the first through hole GO1 and the second through hole GO2. The third through hole GO3 is formed in an area other than the area where the connection pattern CP is formed.

The gate insulating film GI includes an opening above the storage capacitor stem CsT located closest to the electrically-isolated gate terminal GT. Therefore, on the instant the source film SF is deposited, the charge accumulated on the gate terminal GT moves to the storage capacitor stem CsT, which is connected to SR, via the first through hole GO1 and the third through hole GO3. Thus, it is possible to prevent ESD. The third through hole GO3 is formed in an area other than the area where the connection pattern CP is formed. In other words, the portion of the source film SF that is in the area of the third through hole GO3 is removed when the connection pattern CP is formed by a photolithography method. Therefore, it is possible to prevent a leak between the gate bus line GL and the storage capacitor stem CsT.

It is preferred that the distance 1 between the first through hole GO1 and the storage capacitor stem CsT is longer than the distance 2 between the third through hole GO3 and the storage capacitor stem CsT along the virtual line extending between the first through hole GO1 and the third through hole GO3. Thus, it is possible to more reliably prevent ESD.

Note that in the present embodiment, the virtual line extending between the first through hole GO1 and the third through hole GO3 is a line of the shortest path between the edge of a portion of the surface of the gate terminal GT that is exposed through the first through hole GO1 and the edge of a portion of the surface of the storage capacitor stem CsT that is exposed through the third through hole GO3. The distance 1 between the first through hole GO1 and the storage capacitor stem CsT is the distance, along the virtual line, between the edge of a portion of the surface of the gate terminal GT that is exposed through the first through hole GO1 and the edge of the storage capacitor stem CsT. Similarly, the distance 2 between the third through hole GO3 and the storage capacitor stem CsT is the distance, along the virtual line, between the edge of a portion of the surface of the storage capacitor stem CsT that is exposed through the third through hole GO3 and the edge of the storage capacitor stem CsT.

Embodiment 3

Figure 5:
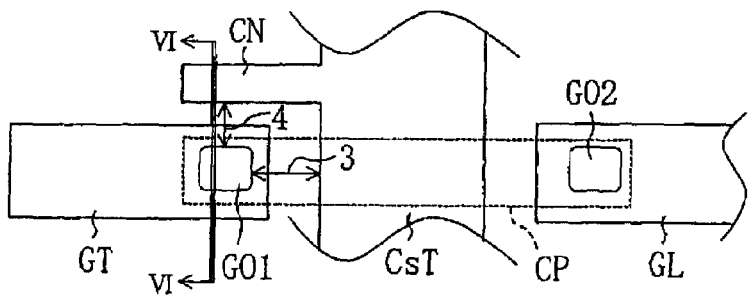
FIG. 5 is a schematic plan view illustrating a wiring substrate of Embodiment 3

A wiring substrate of Embodiment 3 is an embodiment of a wiring substrate according to the third aspect of the present invention. FIG. 5 is a schematic plan view illustrating the wiring substrate of Embodiment 3, and FIG. 6 is a cross-sectional view taken along line VI-VI of FIG. 5.

The wiring substrate of the present embodiment includes SR (not shown) formed along the periphery of the substrate, the gate terminal GT that is coplanar with and independent of SR, the gate bus line GL that is coplanar and continuous with SR, the storage capacitor stem CsT that is located between the gate terminal GT and the gate bus line GL and is coplanar and continuous with SR, and the gate insulating film GI covering the gate terminal GT, the gate bus line GL and the storage capacitor stem CsT. The gate insulating film GI includes the first through hole GO1 reaching the gate terminal GT, and the second through hole GO2 reaching the gate bus line GL.

The gate terminal GT and the gate bus line GL are electrically connected to each other by the connection pattern CP bridging the storage capacitor stem CsT via the first through hole GO1 and the second through hole GO2. The storage capacitor stem CsT includes a protruding portion CN in an area other than the area where the connection pattern CP is formed. The protruding portion CN is coplanar with SR and is protruding toward the gate terminal GT. The distance 3 between the first through hole GO1 and the storage capacitor stem CsT in the area where the connection pattern CP is formed is longer than the distance 4 between the first through hole GO1 and the protruding portion CN.

Figure 6:
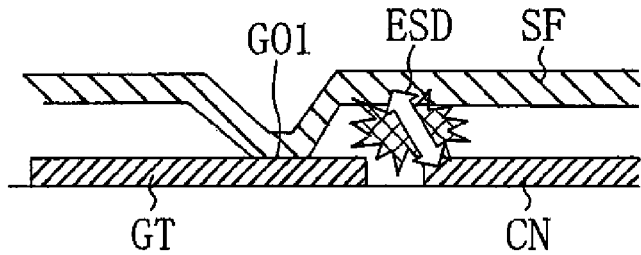
FIG. 6 is a cross-sectional view taken along line VI-VI of FIG. 5.

On the instant the source film SF is deposited, before the entire surface of the substrate is brought to an equipotential state, the potential difference (charge) created between the gate terminal GT and the lines connected to SR due to triboelectric charging, or the like, passes to the closest line portion connected to SR, i.e., the protruding portion CN of the storage capacitor stem CsT, thereby causing ESD (see FIG. 6).

Moreover, the pattern of the protruding portion CN is formed in an area other than the area where the connection pattern CP is formed. Thus, it is possible to prevent a leak, via ESD, between the gate bus line GL and the storage capacitor stem CsT, thereby improving the production yield of the final products.

Note that in the present embodiment, the distance 3 between the first through hole GO1 and the storage capacitor stem CsT in the area where the connection pattern CP is formed is, strictly speaking, the shortest distance between the edge of a portion of the surface of the gate terminal GT that is exposed through the first through hole GO1 and the edge of the storage capacitor stem CsT in the area where the connection pattern CP is formed. Similarly, the distance 4 between the first through hole GO1 and the protruding portion CN is the shortest distance between the edge of a portion of the surface of the gate terminal GT that is exposed through the first through hole GO1 and the edge of the protruding portion CN.

Embodiment 4

Figure 7:
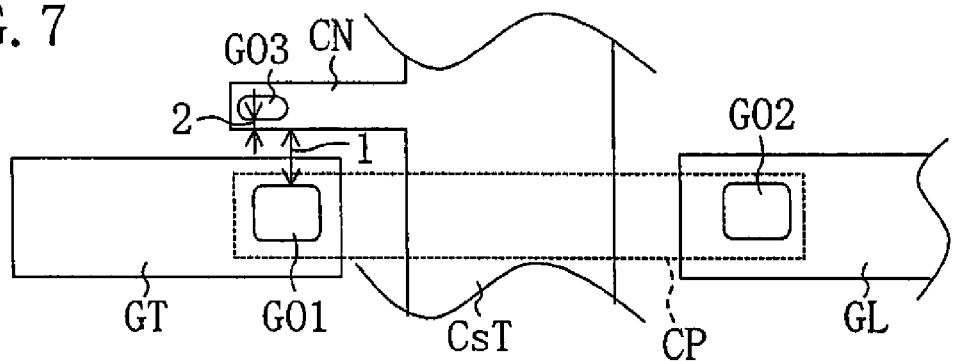
FIG. 7 is a schematic plan view illustrating a wiring substrate of Embodiment 4.

A wiring substrate of Embodiment 4 is a variation of Embodiment 3. FIG. 7 is a schematic plan view illustrating the wiring substrate of Embodiment 4.

In the wiring substrate of the present embodiment, the gate insulating film GI includes the third through hole GO3 reaching the protruding portion CN in the area where the protruding portion CN is formed. The charge accumulated on the gate terminal GT is urged to pass to the protruding portion CN that is closest to the gate terminal GT. When the gate insulating film GI includes the third through hole GO3 above the protruding portion CN, the resistance when ESD is caused is considerably larger than the resistance when a charge passes to the protruding portion CN via the third through hole GO3, whereby the charge passes along the path of the lower resistance. Thus, the charge accumulated on the gate terminal GT passes to the protruding portion CN via the third through hole GO3. Therefore, by forming the third through hole GO3, it is possible to suppress the occurrence of ESD.

It is preferred that the distance 1 between the first through hole GO1 and the protruding portion CN is longer than the distance 2 between the third through hole GO3 and the protruding portion CN along the virtual line extending between the first through hole GO1 and the third through hole GO3. Thus, it is possible to more reliably prevent ESD.

Note that in the present embodiment, the virtual line extending between the first through hole GO1 and the third through hole GO3 is a line of the shortest path between the edge of a portion of the surface of the gate terminal GT that is exposed through the first through hole GO1 and the edge of a portion of the surface of the protruding portion CN that is exposed through the third through hole GO3. The distance 1 between the first through hole GO1 and the protruding portion CN is the distance, along the virtual line, between the edge of a portion of the surface of the gate terminal GT that is exposed through the first through hole GO1 and the edge of the protruding portion CN. Similarly, the distance 2 between the third through hole GO3 and the protruding portion CN is the distance, along the virtual line, between the edge of a portion of the surface of the protruding portion CN that is exposed through the third through hole GO3 and the edge of the protruding portion CN.

Embodiment 5

Figure 8:
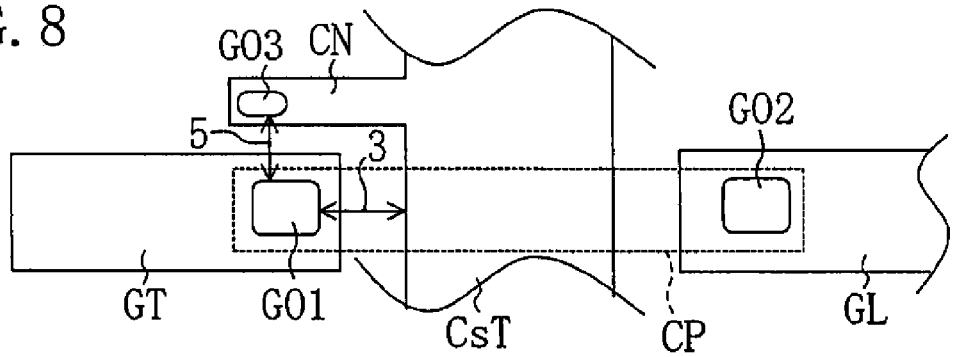
FIG. 8 is a schematic plan view illustrating a wiring substrate of Embodiment 5.

A wiring substrate of Embodiment 5 is a variation of Embodiment 4. FIG. 8 is a schematic plan view illustrating the wiring substrate of Embodiment 5. As illustrated in FIG. 8, the distance 3 between the first through hole GO1 and the storage capacitor stem CsT in the area where the connection pattern CP is formed is longer than the distance 5 between the first through hole GO1 and the third through hole GO3. Thus, it is possible to more reliably suppress the occurrence of ESD in the area where the connection pattern CP is formed.

Note that in the present embodiment, the distance between the first through hole GO1 and the third through hole GO3 is the shortest distance between the edge of a portion of the surface of the gate terminal GT that is exposed through the first through hole GO1 and the edge of a portion of the surface of the protruding portion CN that is exposed through the third through hole GO3.

Figure 9:
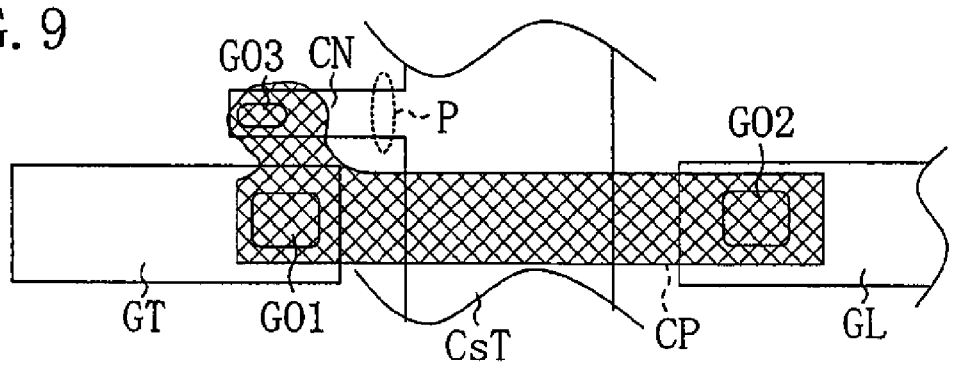
FIG. 9 is a plan view illustrating an occurrence of a leak between a gate insulating film GI and a storage capacitor stem CsT via a connection pattern CP.

After the source film SF is deposited and patterned, a patterning defect such as a film residue (a portion of a film remaining in an area where the film is intended to be removed) or pattern deformation may occur due to dust (foreign matter). In the wiring substrate of the present embodiment, the connection pattern CP may inadvertently be electrically connected to the protruding portion CN via the third through hole GO3 because of a patterning defect such as a film residue or pattern deformation due to dust, thereby causing a leak between the gate terminal GT and the storage capacitor stem CsT. FIG. 9 is a plan view illustrating an occurrence of a leak between the gate terminal GT and the storage capacitor stem CsT via the connection pattern CP. In the wiring substrate illustrated in FIG. 9, the connection pattern CP is patterned in a distorted planar shape because of a patterning defect such as a film residue due to dust, whereby the connection pattern CP is electrically connected to the protruding portion CN via the third through hole GO3. Thus, a leak occurs between the gate terminal GT and the storage capacitor stem CsT via the connection pattern CP connecting the first through hole GO1 with the third through hole GO3.

Such an abnormal wiring substrate can be detected during an inspection step, or the like. A wiring substrate that is detected to be abnormal can be subjected to a repair step to rectify the leak. Specifically, a connecting portion P between the protruding portion CN and the storage capacitor stem CsT can be cut off so that the protruding portion CN becomes independent of the storage capacitor stem CsT, thereby avoiding a signal leak between the gate terminal GT and the storage capacitor stem CsT. The connecting portion P can be cut off by using, for example, an energy beam such as a laser beam or an ion beam. It is preferred that the connecting portion P of the protruding portion CN of the storage capacitor stem CsT is narrow in width so that the connecting portion P can be cut off in a subsequent repair step by using a laser beam, or the like. For example, the width of the connecting portion P may be about 3 to 20 μm, and preferably about 5 to 10 μm.

EXAMPLE

Figure 10:
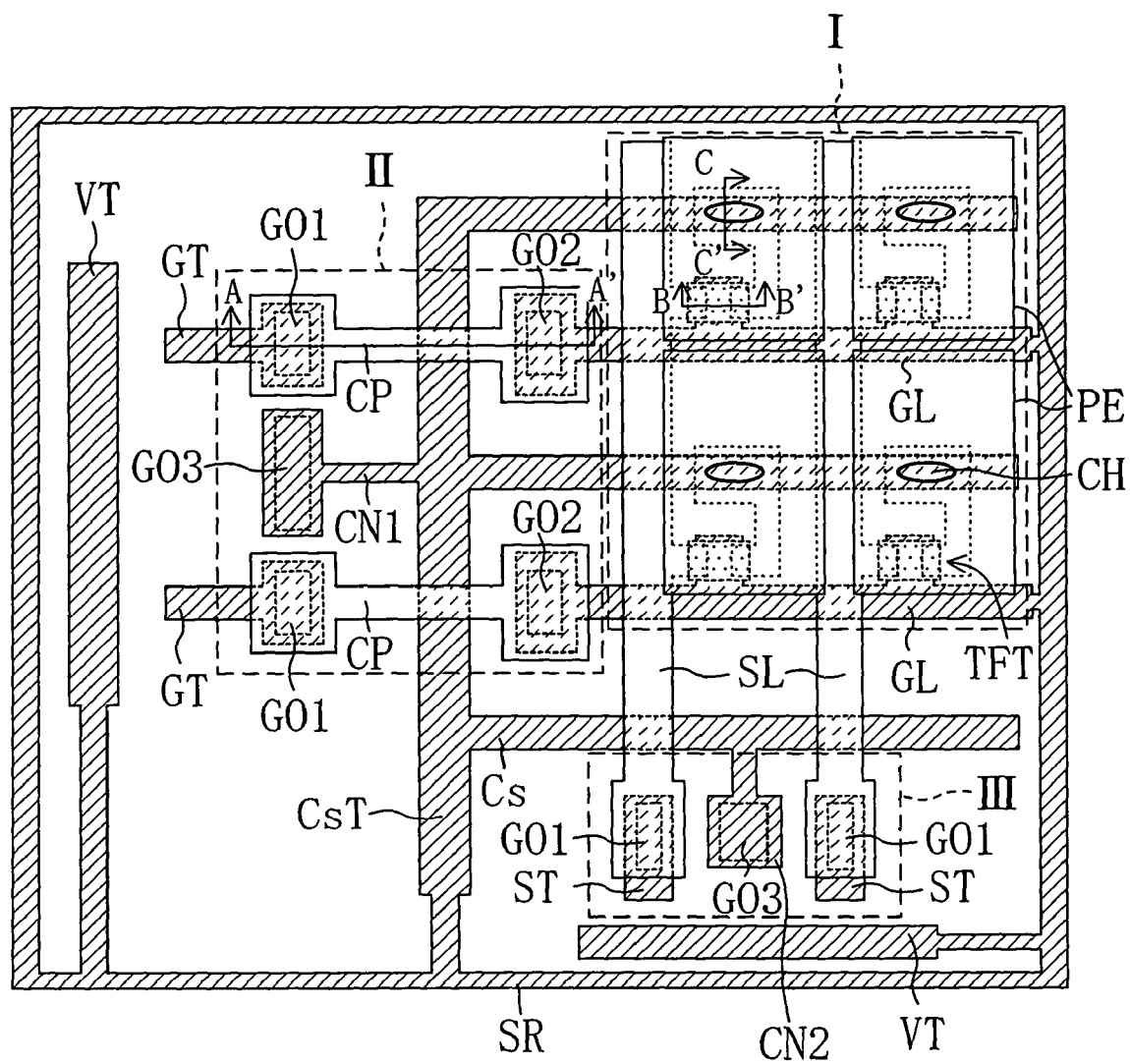
FIG. 10 is a plan view schematically illustrating an entire wiring substrate of one example of the present invention.

FIG. 10 is a plan view schematically illustrating an entire wiring substrate of one example of the present invention. The wiring substrate of this example includes an active area section I, a gate terminal section II and a source terminal section III.

The wiring substrate of this example includes SR formed along the periphery of the substrate, the gate terminals GT and source terminals ST each being coplanar with and independent of SR, and the gate bus lines GL and the storage capacitor lines Cs each being coplanar and continuous with SR. The gate bus lines GL and the storage capacitor lines Cs are extending in parallel to each other in the row direction. The storage capacitor stem CsT connecting together a plurality of storage capacitor lines Cs extends in the column direction between the gate bus lines GL and the gate terminals GT. Moreover, the terminal VT for supplying a power supply voltage to the IC chip is formed in the IC chip attachment area.

A first protruding portion CNI protruding from the storage capacitor stem CsT is located between the gate terminals GT, arranged in the column direction. Moreover, a second protruding portion CN2 protruding from the storage capacitor line Cs is located between the source terminals ST, arranged in the row direction. A gate insulating film (not shown) is deposited on these line patterns. The gate insulating film includes the first through holes GO1 and the second through holes GO2 near one end of the gate terminals GT and the gate bus lines GL, respectively. Each gate terminal GT is electrically connected to the corresponding gate bus line GL by the connection pattern CP bridging the storage capacitor stem CsT via the first through hole GO1 and the second through hole GO2. Similarly, the gate insulating film includes the third through holes GO3 near the end of the first and second protruding portions CN1 and CN2.

The source bus lines SL extending in the column direction are formed on the gate insulating film. A TFT is formed near each intersection between the source bus line SL and the gate bus line GL. A pixel electrode PE is formed in each area that is partitioned by the source bus lines SL and the gate bus lines GL, with a plurality of pixel electrodes PE being arranged in a matrix pattern in the active area section I. Each pixel electrode PE is connected to the corresponding TFT via a contact hole CH. One end of each source bus line SL overlaps with the corresponding source terminal ST via the gate insulating film. The gate insulating film includes the first through holes GO1 each in the area where the source terminal ST is formed. Each source bus line SL and the corresponding source terminal ST are electrically connected to each other via the first through hole GO1 formed in the gate insulating film.

Figure 11:
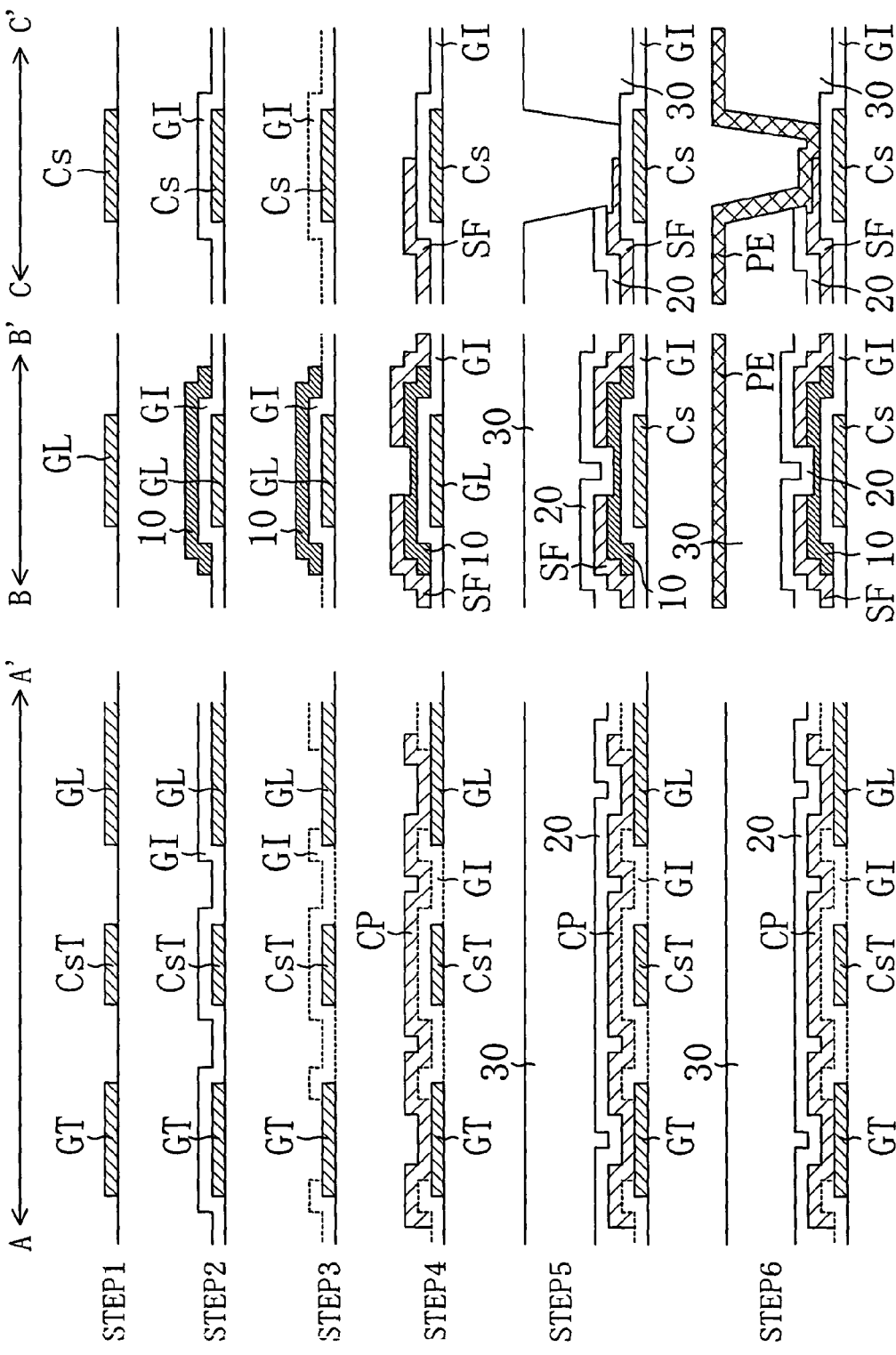
FIG. 11A, FIG. 11B and FIG. 11C are cross-sectional views illustrating various steps for manufacturing the wiring substrate, taken along line A-A', line B-B' and line C-C', respectively, of FIG. 10.

Next, the steps of manufacturing the wiring substrate of this example will be described with reference to the drawings. FIG. 11A, FIG. 11B and FIG. 11C are cross-sectional views illustrating various steps for manufacturing the wiring substrate, taken along line A-A', line B-B' and line C-C', respectively, of FIG. 10. FIG. 12 to FIG. 16 are plan views schematically illustrating the wiring substrate in various steps.

Step 1

Figure 12:
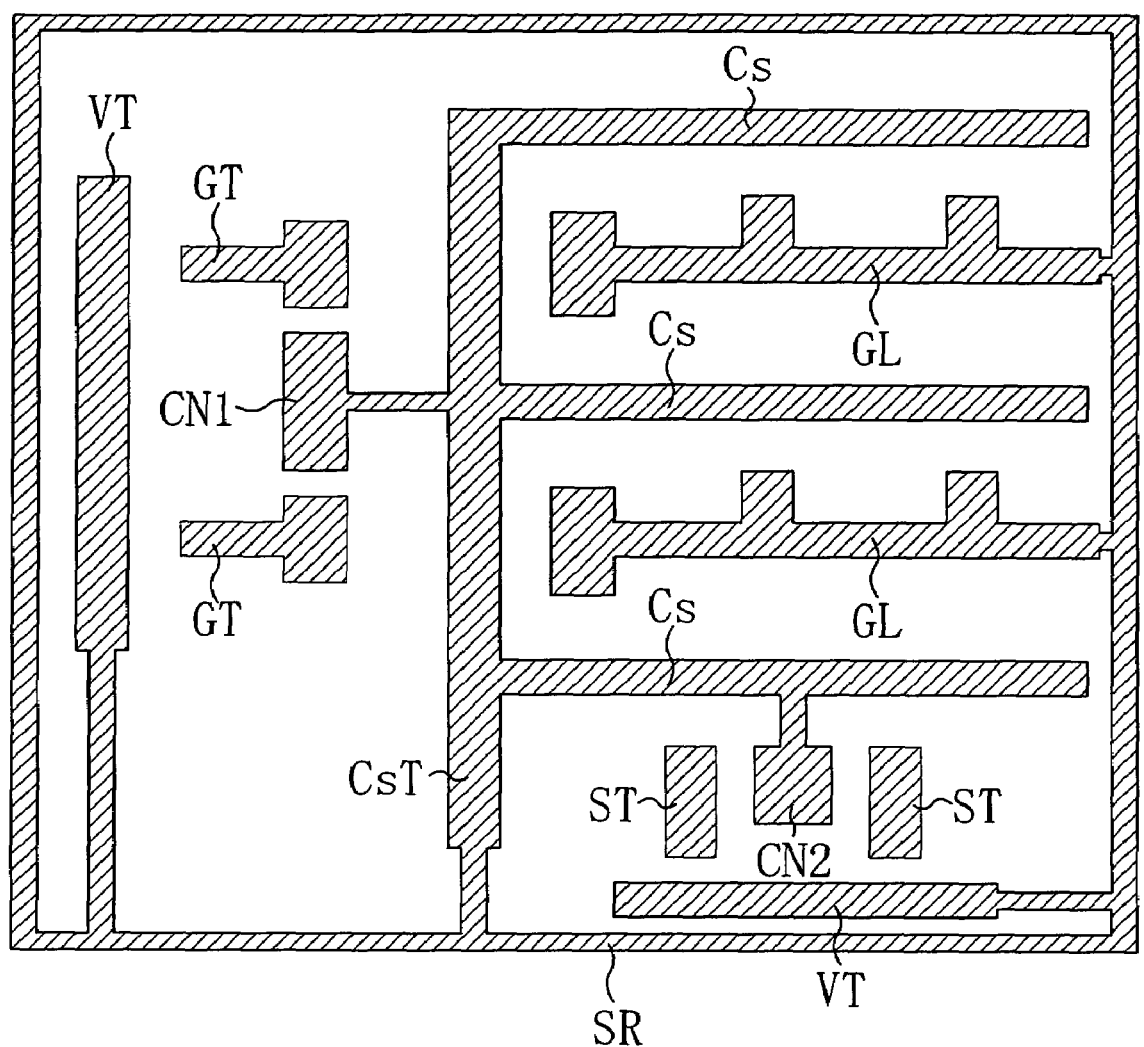
FIG. 12 is a plan view schematically illustrating the wiring substrate in Step 1.
Figure 13:
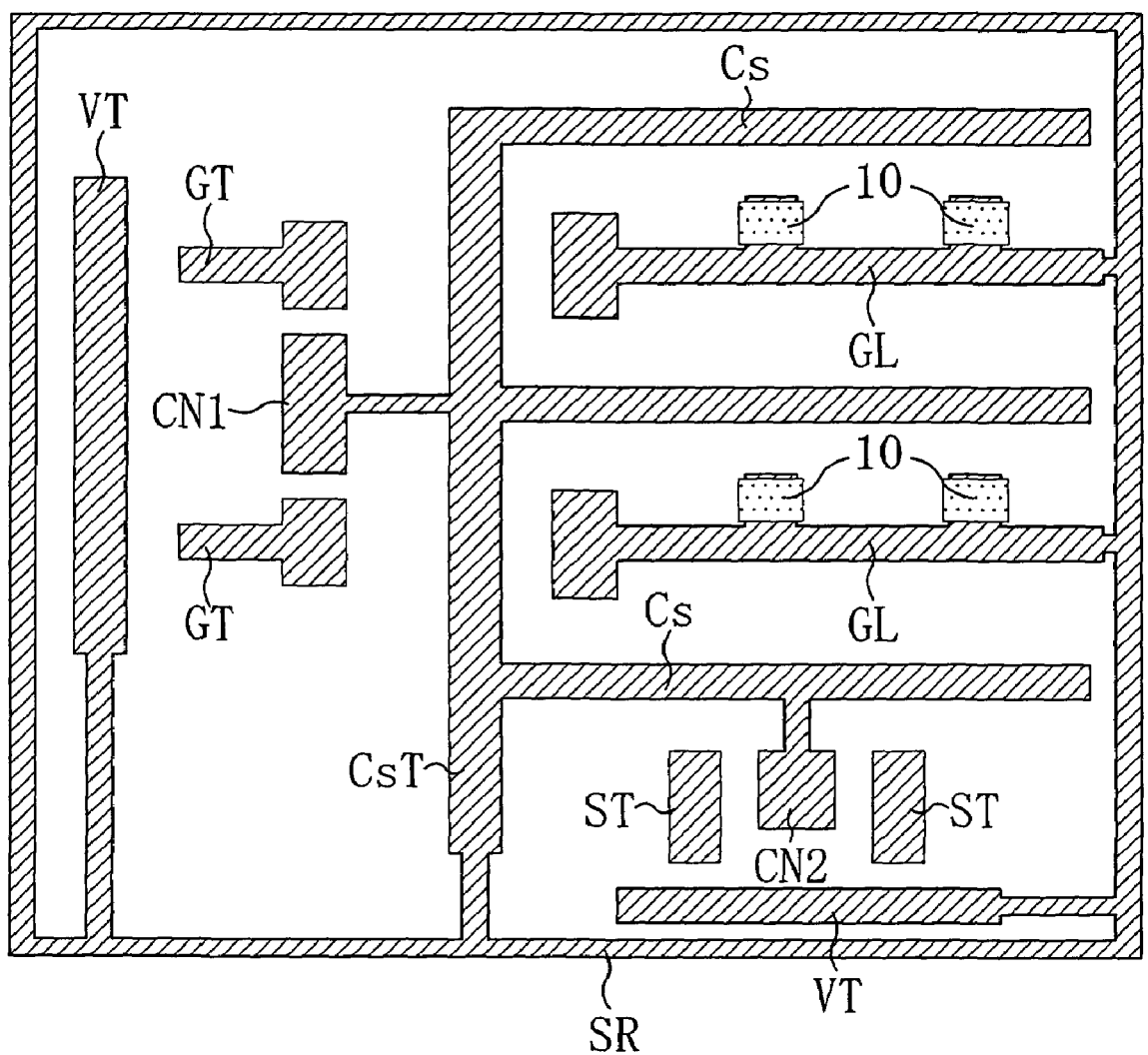
FIG. 13 is a plan view schematically illustrating the wiring substrate in Step 2.

A conductive film, from which gate bus lines, etc., are to be formed, is deposited on a cleaned insulative substrate, e.g., a glass substrate, by using a reactive sputtering apparatus. For example, a conductive film of TiN/Al/Ti (50/100/30 nm) is deposited. After a resist film is patterned by a photolithography process, or the like, the gate bus lines, etc., are formed by using a reactive ion etching (RIE)-mode dry etcher, for example, and the resist is stripped away by using a chemical solution such as a resist stripper solution (see FIG. 12). As illustrated in FIG. 12, the gate terminals GT and the gate bus lines GL are opposing each other in the row direction with the storage capacitor stem CsT therebetween. The gate bus lines GL, the storage capacitor stem CsT and the storage capacitor lines Cs are connected to SR.

The gate terminals GT and the source terminals ST are in an island structure and are not connected to SR. In this example, two gate terminals GT are provided immediately adjacent to the first protruding portion CN1 protruding from the storage capacitor stem CsT so that the gate terminals GT are opposing each other in the column direction with the first protruding portion CN1 therebetween. Moreover, two source terminals ST are provided immediately adjacent to the second protruding portion CN2 protruding from the storage capacitor line Cs so that the source terminals ST are opposing each other in the row direction with the second protruding portion CN2 therebetween. By forming a conductive film to be described later, from which the source bus lines SL are to be formed, on the gate insulating film GI to be described later, the gate terminals GT and the source terminals ST are electrically connected to SR via the first through holes GO1 formed in the gate insulating film GI.

Step 2

The gate insulating film (400 nm) GI, an a-Si film (150 nm) and an $n^+$-Si film (40 nm) are deposited successively using a CVD apparatus in order to form a TFT semiconductor 10. A photoresist is applied, and the $n^+$-Si/a-Si film is etched by using a plasma etching (PE)-mode dry etcher to form semiconductor islands. Then, the island-forming photoresist is stripped away by using a chemical solution such as a resist stripper solution (see FIG. 13).

Step 3

A photoresist is applied and patterned so as to form openings therein, corresponding to the gate bus lines GL, the gate terminals GT, the source terminals ST and the first and second protruding portions CN1 and CN2. The exposed portions of the gate insulating film GI are etched away by using an RIE-mode dry etcher. Then, the photoresist is stripped away by using a chemical solution such as a resist stripper solution (see FIG. 14). By forming the first and second through holes GO1 and GO2 in the gate insulating film GI, the gate bus lines GL and the gate terminals GT can be electrically connected to each other.

Figure 14:
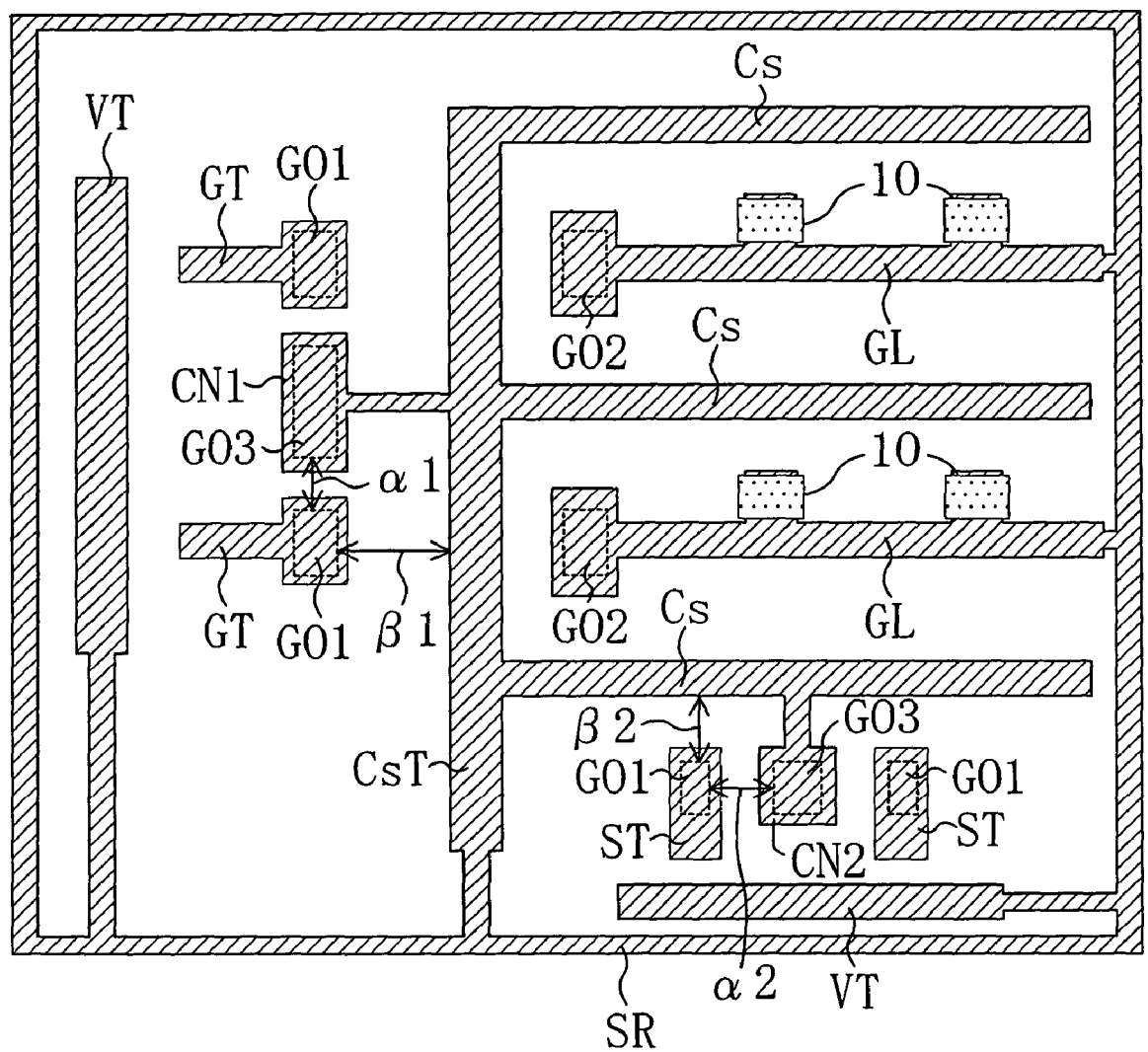
FIG. 14 is a plan view schematically illustrating the wiring substrate in Step 3.
Figure 15:
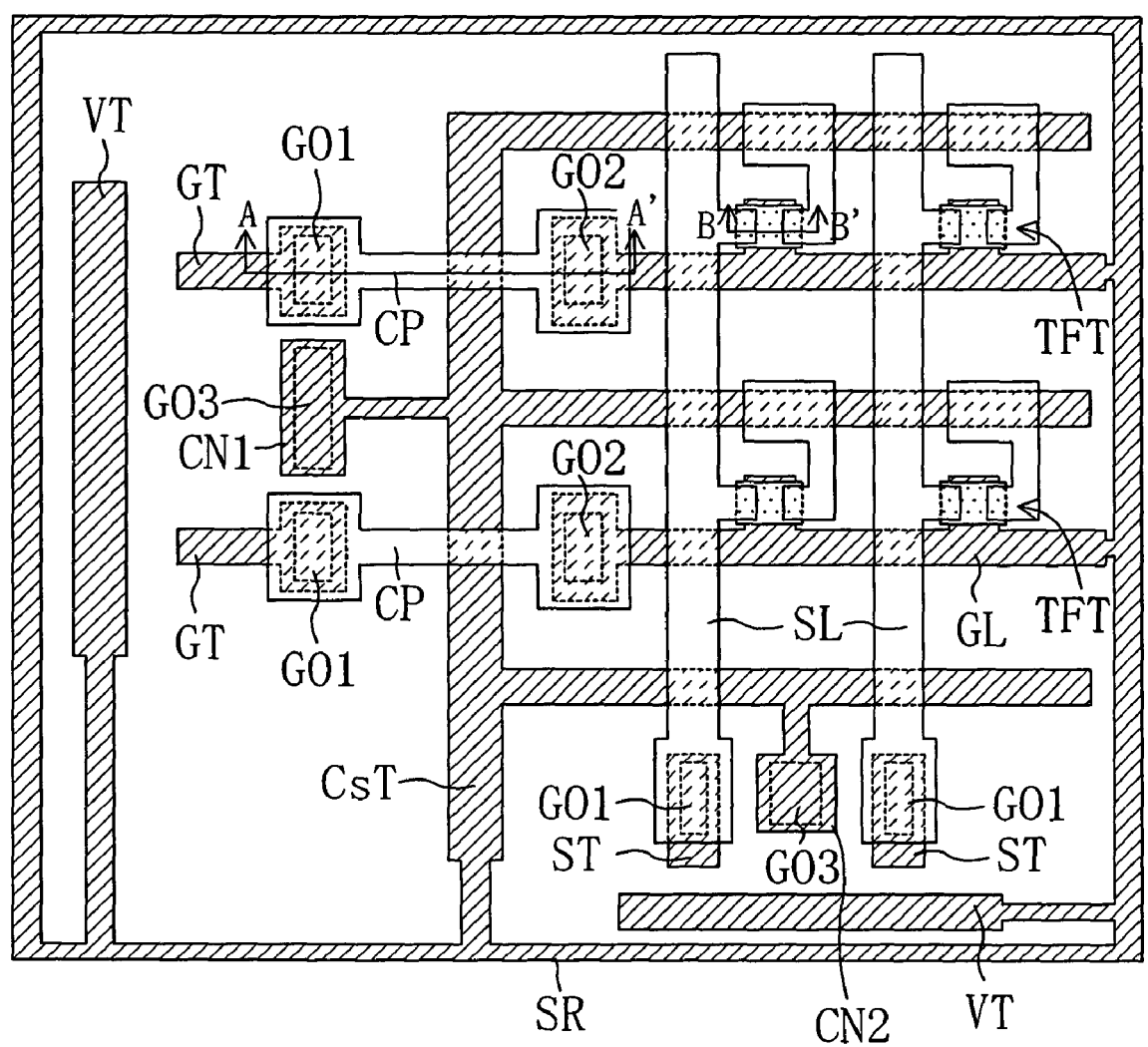
FIG. 15 is a plan view schematically illustrating the wiring substrate in Step 4.
Figure 16:
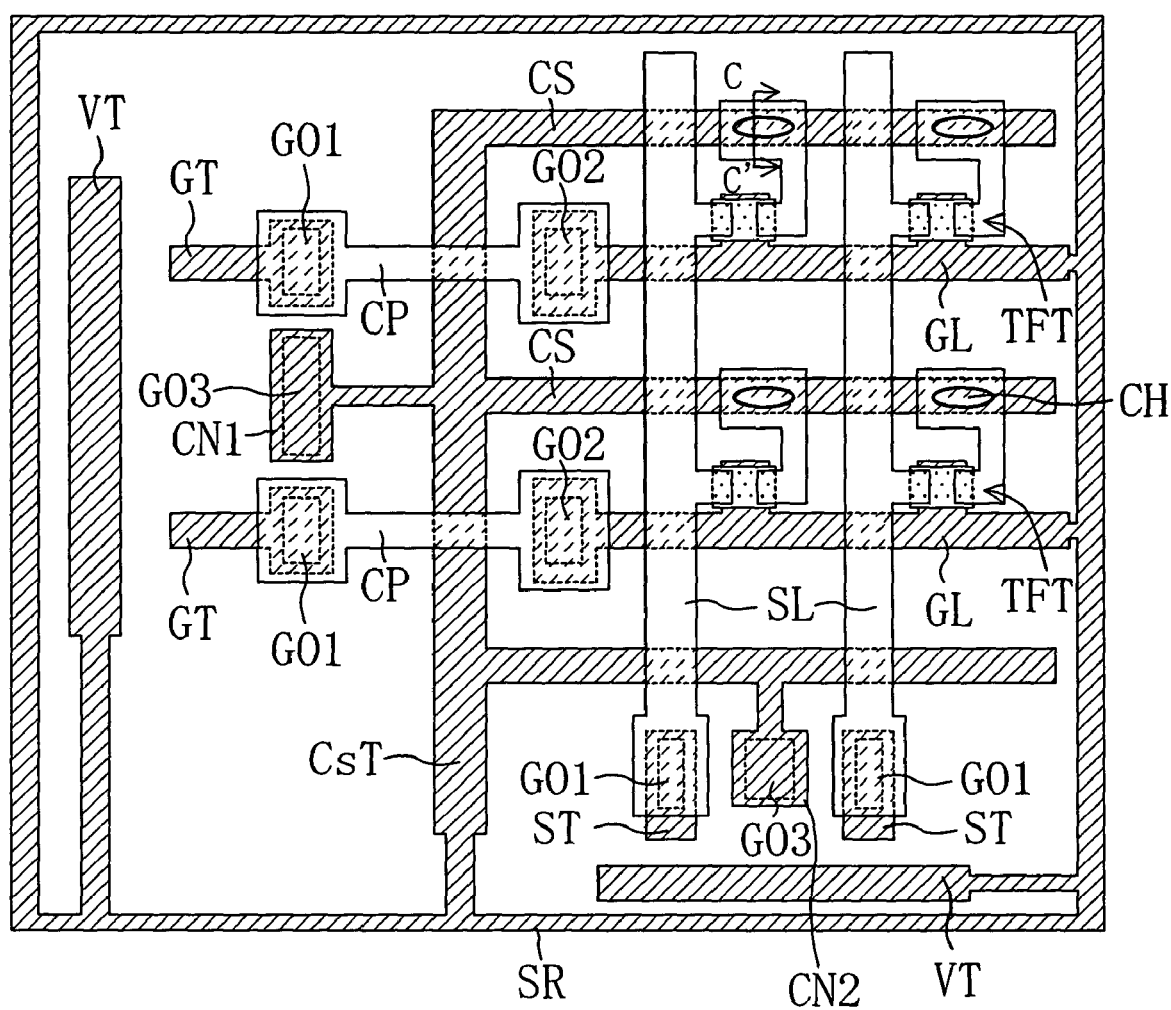
FIG. 16 is a plan view schematically illustrating the wiring substrate in Step 5.

As illustrated in FIG. 14, the distance $\beta 1$ is set to be longer than the distance $\alpha 1$, where $\alpha 1$ is the distance between the first through hole GO1 in the area where the gate terminal GT is formed and the third through hole GO3 in the area where the first protruding portion CN1 is formed, and $\beta 1$ is the distance between the first through hole GO1 and the storage capacitor stem CsT. In other words, the distance ratio $\beta 1/\alpha 1$ is set to be greater than 1. In this example, the distance ratio $\beta 1/\alpha 1$ is set to be about 5, for example.

Similarly, the distance $\beta 2$ is set to be longer than the distance $\alpha 2$, where $\alpha 2$ is the distance between the first through hole GO1 in the area where the source terminal ST is formed and the third through hole GO3 in the area where the second protruding portion CN2 is formed, and $\beta 2$ is the distance between the first through hole GO1 and the storage capacitor line Cs.

Then, the source metal film SF is deposited. Glass substrates are carried in a carrier cassette into a deposition apparatus. The substrates are taken out of the cassette one by one with a fork- or plate-shaped arm, and placed on the chuck stage of the pre-deposition web cleaner (e.g., a dry cleaner or a vacuum cleaner) for pre-deposition cleaning. Then, the cleaned substrate is picked up by the robot arm and lifted up off the chuck stage. As the glass substrate is lifted up, it is triboelectrically charged. Different portions of the substrate are separated from the stage at various times due to factors such as bending or warping of the glass being lifted, the shape of the stage, and the position of the lift pins used for lifting up the substrate off the stage.

The triboelectric charging occurs upon lifting the glass substrate off the stage, and the amount of charge to be created depends on the contact area. The substrate being separated from the stage at various times means that the contact area between the substrate and the stage is changing after the start of the separation of the substrate off the stage until the substrate is completely separated from the stage. Therefore, the amount of charge created is also changing during this period while the substrate is being separated from the stage. Thus, the glass substrate is charged unevenly across the surface thereof The charge on portions that are connected to SR is made uniform across the glass surface. However, the charge on the gate terminals GT and the source terminals ST, which are islands, cannot move, thereby creating a potential difference (charge) between SR and the gate terminals GT and between SR and the source terminals ST.

Conductive films are deposited on the glass substrate in such a state by using a reactive sputtering apparatus, or the like. For example, two source metal (Al/Ti) layers are formed (100/50 nm). In the deposition step, on the instant the first layer, the Ti layer, is deposited, the gate bus lines GL, the gate terminals GT, the source terminals ST and the storage capacitor stem CsT are electrically connected together via the through holes GO1 to GO3, thereby bringing the entire substrate to an equipotential state.

Consider a case where the distance $\alpha$ between the through hole GO1 in the island formation area and the through hole GO3 in the area where a line connected to SR is formed is longer than the distance $\beta$ between the through hole GO1 to the edge of a line. Specifically, the distance a is the distance between the first through hole GO1 in the area where the gate terminal GT is formed and the third through hole GO3 in the area where the first protruding portion CN1 is formed, or the distance between the first through hole GO1 in the area where the source terminal ST is formed and the third through hole GO3 in the area where the second protruding portion CN2 is formed. The distance $\beta$ is the distance between the first through hole GO1 in the area where the gate terminal GT is formed and the edge of the storage capacitor stem CsT, or the distance between the first through hole GO1 in the area where the source terminal ST is formed and the edge of the storage capacitor line Cs. If the distance $\alpha$ is longer than the distance $\beta$, and if there is no through hole in the area where the storage capacitor stem CsT or the storage capacitor line Cs is formed, or the through hole is distant from the edge of the storage capacitor stem CsT or the storage capacitor line Cs, the charge accumulated on the gate terminal GT (island portion) is discharged to the edge of a line covered with an insulating film (the storage capacitor stem CsT or the storage capacitor line Cs) while breaking through the gate insulating film GI, on the instant a conductive film is deposited.

In this example, the charge accumulated on the gate terminal GT flows to the storage capacitor stem CsT and then to SR via the third through hole GO3 of the closest first protruding portion CN1. Similarly, the charge accumulated on the source terminal ST flows to the storage capacitor line Cs and then to SR via the third through hole GO3 of the closest second protruding portion CN2. Therefore, the entire surface is brought to an equipotential state on the instant a conductive film is deposited, whereby an ESD damage does not occur.

Step 4

A source Ti film and a source Al film are deposited successively, thereby forming the source film SF. Then, a photoresist is applied thereon. The source/drain Al film etched by using an etchant such as an $H_3PO_4$—$HNO_3$—$CH_3COOH$ etchant. Note that the source Al film and the source Ti film may be dry-etched successively.

The TFT portions formed in an island structure are etched by using a PE-mode dry etcher so as to form the channels. Note that the channels may be formed by etching successively after the successive dry etching of the Al and Ti films.

When the channels are formed, the connection patterns CP connecting the gate bus lines GL with the gate terminals GT are also formed. Moreover, the source bus lines SL connected to the source terminals ST via the first through holes GO1 formed in the gate insulating film are formed. The source/drain-forming photoresist is stripped away by using a chemical solution such as a resist stripper solution (see FIG. 15).

Step 5

After depositing a TFT protection SiN film 20 (200 nm) as a first interlayer insulating film by using a CVD apparatus, an organic resin film 30 is applied thereon as a second interlayer insulating film. The material of the organic resin film 30 may be, for example, an acrylic resin, a polyimide resin, or the like, to which a photosensitizer is added, that can be exposed and developed, as a photoresist such as a phenol novolac resin. Since the organic resin film 30 is used as an interlayer insulating film, the organic resin film 30 is such that it is not stripped away in a resist stripping process in a subsequent pixel electrode formation step. This property of the organic resin film 30 makes it different from a photoresist.

A portion of the TFT protection SiN film in the contact hole CH connecting the drain electrode to the pixel electrode is processed with a PE-mode dry etcher while using the organic resin film 30 as a mask. Thus, the drain electrode and the pixel electrode are connected to each other via the contact hole CH (see FIG. 16). Note however that since the ohmic resistance between the exposed drain Al film and the pixel electrode metal (ITO) is high, the drain electrode Al film is etched with an $H_3PO_4$—$HNO_3$—$CH_3COOH$ etchant, or the like, so as to expose the Ti layer of the source film SF (see FIG. 11C).

Step 6

By using a reactive sputtering apparatus, a pixel electrode ITO film having a thickness of 100 nm is deposited, and a photoresist is formed. The ITO film is etched by using a ferric chloride ($FeCl_3$) etchant, or the like, to form the pixel electrodes PE. Finally, the pixel electrode photoresist is stripped away by using a chemical solution such as a resist stripper solution (see FIG. 10).

An active matrix substrate is manufactured through these steps. The active matrix substrate can be used in a liquid crystal display device, an organic or inorganic EL (electroluminescent) display device, a plasma display device, an electrochromic display device, or the like. For example, the manufacture of a liquid crystal display device using the active matrix substrate will now be described briefly. An alignment film is formed on the active matrix substrate and on a counter substrate opposing the active matrix substrate, and the alignment films are subjected to a rubbing treatment. The active matrix substrate and the counter substrate are attached together via a sealant, and a liquid crystal material is filled into the gap therebetween, thus obtaining a liquid crystal panel. Thereafter, SR is removed in the scribing step or the beveling step. COG gate and source drivers are attached to the IC chip attachment area of the liquid crystal panel.

In this example, where portions of a TFT (e.g., the gate terminal GT and the source terminal ST) are in an island structure, the protruding portions CN1 and CN2, which are continuous with the short ring are placed near the islands, and the third through holes GO3 are provided in the gate insulating film GI above the protruding portions CN1 and CN2. Then, the charge (potential difference) created in the islands can be passed to the protruding portions CN1 and CN2 via the source metal film SF to be deposited later. Thus, it is possible to prevent an ESD damage.

According to the present invention, it is possible to reduce the possibility of a product to become defective due to ESD. Thus, it is possible to improve the production yield, to reduce the manufacturing cost, and to improve the throughput.

While the present invention has been described in preferred embodiments, it will be apparent to those skilled in the art that the disclosed invention may be modified in numerous ways and may assume many embodiments other than those specifically set out and described above. Accordingly, it is intended by the appended claims to cover all modifications of the invention that fall within the true spirit and scope of the invention.

What is claimed is:

1. A wiring substrate, comprising a short ring formed along a periphery of the substrate, an independent line pattern that is coplanar with and independent of the short ring, a first continuous line pattern that is coplanar and continuous with the short ring, a second continuous line pattern that is located between the independent line pattern and the first continuous line pattern and is coplanar and continuous with the short ring, and an insulating film covering the independent line pattern and the first and second continuous line patterns, wherein: the insulating film includes a first through hole reaching the independent line pattern, a second through hole reaching the first continuous line pattern, and a third through hole reaching the second continuous line pattern; the independent line pattern and the first continuous line pattern are electrically connected to each other by a connection pattern bridging the second continuous line pattern via the first through hole and the second through hole; and the third through hole is formed in an area other than an area where the connection pattern is formed.

2. The wiring substrate of claim 1, wherein a distance between the first through hole and the second continuous line pattern is longer than a distance between the third through hole and the second continuous line pattern along a virtual line extending between the first through hole and the third through hole.

3. A wiring substrate, comprising a short ring formed along a periphery of the substrate, an independent line pattern that is coplanar with and independent of the short ring, a first continuous line pattern that is coplanar and continuous with the short ring, a second continuous line pattern that is located between the independent line pattern and the first continuous line pattern and is coplanar and continuous with the short ring, and an insulating film covering the independent line pattern and the first and second continuous line patterns, wherein: the insulating film includes a first through hole reaching the independent line pattern and a second through hole reaching the first continuous line pattern; the independent line pattern and the first continuous line pattern are electrically connected to each other by a connection pattern bridging the second continuous line pattern via the first through hole and the second through hole; the second continuous line pattern includes a protruding portion that is located in an area other than an area where the connection pattern is formed and is protruding toward the independent line pattern while being coplanar with the short ring; and a distance between the first through hole and the second continuous line pattern in the area where the connection pattern is formed is longer than a distance between the first through hole and the protruding portion.

4. The wiring substrate of claim 3, wherein the insulating film includes a third through hole reaching the protruding portion in the area where the protruding portion is formed.

5. The wiring substrate of claim 4, wherein a distance between the first through hole and the second continuous line pattern in the area where the connection pattern is formed is longer than a distance between the first through hole and the third through hole.

6. The wiring substrate of claim 4, wherein the connection pattern is electrically connected to the protruding portion via the third through hole, and the protruding portion is independent of the second continuous line pattern.

7. The wiring substrate of claim 4, wherein a distance between the first through hole and the second continuous line pattern is longer than a distance between the third through hole and the second continuous line pattern along a virtual line extending between the first through hole and the third through hole.

8. A display device, comprising the wiring substrate of claim 1.

9. A display device, comprising the wiring substrate of claim 3.

10. A method for manufacturing the wiring substrate of claim 1, comprising the steps of: forming the first through hole and the second through hole in the insulating film; forming a conductive film on the substrate; and patterning the conductive film so as to form the connection pattern.

11. A method for manufacturing the wiring substrate of claim 3, comprising the steps of: forming the first through hole and the second through hole in the insulating film; forming a conductive film on the substrate; and patterning the conductive film so as to form the connection pattern.

12. A method for manufacturing the wiring substrate of claim 6, comprising the steps of: forming the first through hole, the second through hole and the third through hole in the insulating film; forming a conductive film on the substrate; patterning the conductive film so as to form the connection pattern; and cutting off a connecting portion between the protruding portion and the second continuous line pattern.

* * * * *